US006188226B1

(12) United States Patent
Ochiai

(10) Patent No.: US 6,188,226 B1
(45) Date of Patent: Feb. 13, 2001

(54) ELECTRIC POTENTIAL SENSOR

(75) Inventor: Chitaka Ochiai, Omihachiman (JP)

(73) Assignee: Murata Manufacturing Co., Ltd. (JP)

( * ) Notice: Under 35 U.S.C. 154(b), the term of this patent shall be extended for 0 days.

(21) Appl. No.: 09/357,492

(22) Filed: Jul. 20, 1999

(30) Foreign Application Priority Data

Jul. 22, 1998 (JP) ................................................ 10-206689

(51) Int. Cl.$^7$ ............................. G01R 5/28; G01R 29/12
(52) U.S. Cl. ........................ 324/458; 324/457; 307/130
(58) Field of Search .................................. 324/109, 457, 324/72, 458; 307/130

(56) References Cited

U.S. PATENT DOCUMENTS

| 4,205,267 | 5/1980 | Williams . |
| 4,518,924 | 5/1985 | Vosteen . |

*Primary Examiner*—Safet Metjahic
*Assistant Examiner*—Vincent Q. Nguyen
(74) *Attorney, Agent, or Firm*—Ostrolenk, Faber, Gerb & Soffen, LLP

(57) ABSTRACT

An electric potential sensor, having: a power source including a first output terminal having a first electric potential, a second output terminal having a second electric potential; a first and a second potential dividing elements connected in series between the first output terminal and the second output terminal; a ground node connected to a mutual connection node of the first potential dividing element and the second potential dividing element; a first resistance element connected between the ground node and an output node; a second resistance element connected between the output node and a detection node; a transistor connected between the first output terminal and the detection node; a pickup device for controlling a base current or a gate voltage of said transistor such that an electric potential of the detection node is equal to an electric potential of a measuring object; and a third resistance element connected between said detection node and the second output terminal.

3 Claims, 3 Drawing Sheets

ELECTRIC POTENTIAL SENSOR

BACKGROUND OF THE INVENTION

1. Field of the Invention

The present invention relates to an electric potential sensor, and more particularly, to a feedback type electric potential sensor which measures the electric potential of an object by causing the electric potential of the sensor to be equal to the electric potential of the object.

2. Description of the Related Art

Recently, many devices (for example a PPC copying machine or a laser printer, an electrostatic dust remover) utilize static electricity. In such devices, a sensor for measuring electric potential at a charged part is essential in order that the electric potential at the charged part can be maintained at a desired value.

FIG. 4 is a schematic diagram showing an example of such an electric potential sensor. This sensor detects an electric potential Vt of an object OBJ in non-contact manner. The sensor includes a pickup device Pu which calculates the difference between the electric potential Vt of the object OBJ and an electric potential Vdet at a detection node DET and controls the base current IB of transistor Tr so that the difference between the electric potential at the detection node DET and the electric potential Vt of the object OBJ becomes 0. The electric potential Vdet at the detection node DET is divided by resistances Ra and Rb (which are situated between the detection node DET and ground GND) and is output at output node OUT. This output is indicative of the electric potential of the measuring object OBJ is to be measured.

There are several drawbacks to the prior art system. Because one side of the power source HV is grounded, only either a positive electric potential or, alternatively, a negative potential can be measured. Further, due to the influence of the leakage current of the transistor Tr, and the like, it is difficult to accurately measure a 0 V electric potential which may be a threshold value in a measuring range of the sensor. For example, in a sensor used to measure a positive electric potential, a 0 V electric potential and negative electric potentials cannot be distinguished, etc.

To overcome these problems, there has been proposed an electric potential sensor shown in FIG. 5 which can measure both positive and negative electric potentials. In this sensor, two power sources HV1 and HV2, and two transistors Tr1 and Tr2, are provided. The mutual connection node of the power sources HV1 and HV2 is grounded, and resistances Rc and Rd are provided between grounded GRD and the detection node DET. As a result, both positive and negative electric potentials can be measured, and 0 electric potential can be accurately measured. However, the structure of this sensor is complex and its cost is high.

SUMMARY OF THE INVENTION

The present invention is made in view of the foregoing problems associated with the conventional electric potential sensor and provides an electric potential sensor which is capable of measuring both a positive electric potential and a negative electric potential with a simpler configuration than the prior art of FIG. 5. The electric potential sensor is also capable of accurately measuring a 0 V electric potential.

An electric potential sensor according to the present invention comprises a power source, a first and a second potential dividing means, a ground node, a first resistance element, a second resistance element, a transistor, a pickup device, and a third resistance element. The power source includes a first output terminal having a first electric potential, a second output terminal having a second electric potential. The first and the second potential dividing means are connected in series between the first output terminal and the second output terminal. The ground node is connected to a mutual connection node of the first potential dividing means and the second potential dividing means. The first resistance element is connected between the ground node and an output node. The second resistance element is connected between the output node and a detection node. The transistor is connected between the first output terminal and the detection node. The pickup device controls a base current or a gate voltage of the transistor such that an electric potential of the detection node is equal to an electric potential of a measuring object. The third resistance element is connected between the detection node and the second output terminal.

In the above mentioned electric potential sensor, the base current of the transistor is controlled by the pickup device, thereby changing the electric potential of the detection node. When the electric potential of the detection node is made equal to the electric potential of the object being measured, the transistor is stabilized. Usually, because the electric potential at the detection node may be high, a voltage divider comprising first and second potential dividing means (typically first and second resistance elements) is provided to generate an output signal indicative of the measured potential but having a suitably lower potential. Further, because the ground node is connected to the mutual connection node of the first potential dividing means and the second potential dividing means, the measurable range of the sensor is:

$$-\Delta V \left[ \frac{R1}{R1+R2} \right] < Vi < \frac{\Delta V \, R2}{R1+R2}$$

wherein $\Delta V$ is equal to the electric potential across the power source, R1 is the resistance of the first resistance means and R2 is the resistance of the second resistance means and Vi is the detected potential of the object being detected. Accordingly, whether the electric potential of the object being measured is either positive or negative, it can be measured. Further, even if the electric potential of the object being measured is a 0 V electric potential, it can be securely measured because the 0 V electric potential is within a measuring range of the sensor.

Preferably, the above mentioned first and second potential dividing means are resistors. One possible alternative is to substitute either one of the resistors with a Zener diode.

For the purpose of illustrating the invention, there is shown in the drawings several forms which are presently preferred, it being understood, however, that the invention is not limited to the precise arrangements and instrumentalities shown.

DETAILED DESCRIPTION OF THE INVENTION

Hereinafter, the preferred embodiments of the present invention are explained in detail with reference to the drawings. Further, in the figures, the identical or equivalent parts are labeled with the like numerals and the descriptions thereof are not repeated.

First Embodiment

Figure 1:
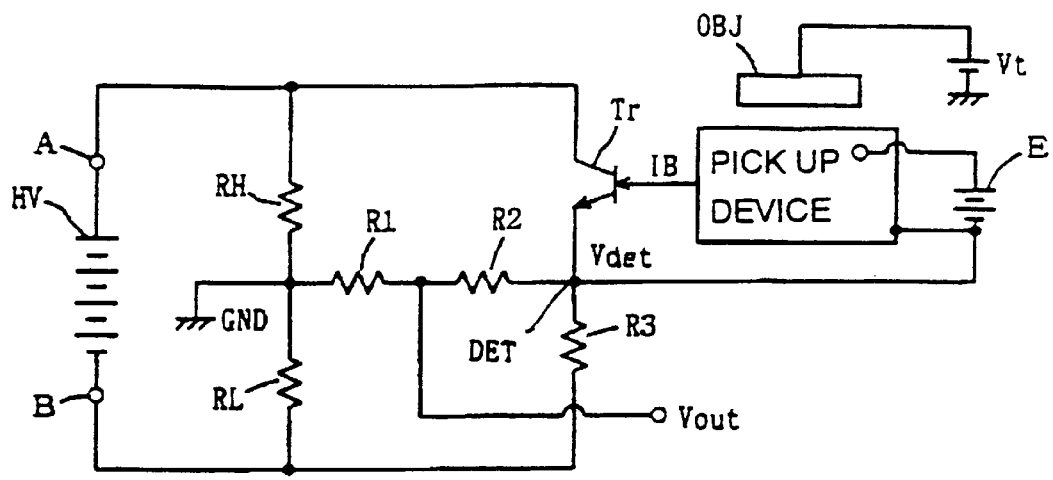
FIG. 1 is a block diagram showing an overall configuration of an electric potential sensor according to a first embodiment of the present invention.

FIG. 1 is a block diagram showing an entire structure of the electric potential sensor according to the first embodiment of the present invention. Referring to FIG. 1, this electric potential sensor comprises the power source HV, resistances RH, RL, R1, R2 and R3, transistor Tr, and a pickup device PU. The power source HV generates a voltage HV between its first and second output terminals A and B. The resistance RH operates as a first potential dividing means and is connected between the first output terminal A of the power source HV and ground GND. The resistance RL operates as a second potential dividing means and is connected between ground GND and the second output terminal B of the power source HV. The transistor Tr is connected between the first output terminal A and the detection node DET. The resistance R3 is connected between the detection node DET and the output terminal B. The resistance R1 is connected between ground GND and the output node OUT. The resistance R2 is connected between the output node OUT and the detection node DET. The pickup device PU, driven by the power source E is connected to the detection node DET and controls the base current IB supplied to the transistor Tr such that the electric potential at detection node DET is made equal to the electric potential Vt of the object OBJ.

The pickup device PU measures the electric potential Vt of the object OBJ in a non-contact manner.

This can be done using various methods, for example, a rotational sector type method, a vibrational capacitance type method, or a chopper type method. All of these methods use the principle of converting a static electrical field into a dynamic electrical signal.

The pick up device PU measures the difference between the detected electric potential Vt and the electric potential Vdet at the detection node DET and applies a base current IB that corresponds to this difference to the transistor Tr. As a result, the electric potential Vdet at the detection node DET is varied to cause the difference between the electric potential Vdet at the detection node DET and the electric potential Vt of the object OBJ to become 0. When this is achieved, the transistor Tr is stabilized with the result that the electric potential of the detection node DET becomes equal to the electric potential Vt of the object OBJ.

Figure 2:
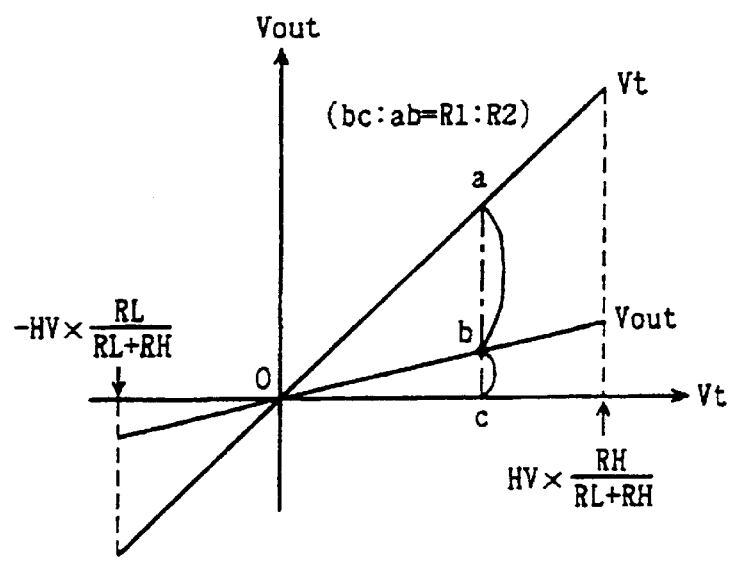
FIG. 2 is a diagram showing the relation between the electric potential of the object being measured and the output voltage of the electric potential sensor.

Since the electric potential Vt (reproduced at the detection node DET) is usually high, it is not desirable to output it as is. Accordingly, the electric potential Vdet at detection node DET is preferably divided into a desirable value by the resistances R1 and R2 and is outputted from the output node OUT as an output voltage Vout. As shown in FIG. 2, Vout=Vdet×R1/(R1+R2). The resulting output voltage Vout is proportional to the electric potential Vt of the object OBJ but is adjusted to a desirable level by appropriately adjusting the resistance value of the resistances R1 and R2.

Because the mutual connection node of the resistances RH and RL is connected to ground GND, the range of electric potential that can appear at the detection node DET is −HV×RL/(RL+RH)~(0V)~HV×RL/(RL+RH), and this range is the measuring range of the electric potential sensor. Accordingly, the electric potential Vt can be measured as long as it falls within this range. Further, even when the electric potential Vt of the object OBJ is 0 V, it can be accurately measured, since 0 V is within a range of the electric potential that can be applied to the detection node DET.

Also, by adjusting the ratio RH/RL, the measuring range of the electric potential sensor can be adjusted. For example, when the resistance value of the resistance RL is made to be 0Ω, the sensor can be used to detect only negative electric potentials. The range of detection can be adjusted as desired to deal with a positive electric potential, a negative electric potential, and both electric potentials.

In summary, because the resistances RH and RL are provided and the mutual connection node thereof is connected to ground GND, both a positive electric potential and a negative electric potential can be measured. Further, by adjusting the resistance values of RH and RL, the sensor can be used to detect a positive electric potential, a negative electric potential, or both electric potentials. Further, a 0 V electric potential can be securely measured, since the 0 V electric potential is within the measuring range of the sensor.

Second Embodiment

Figure 3:
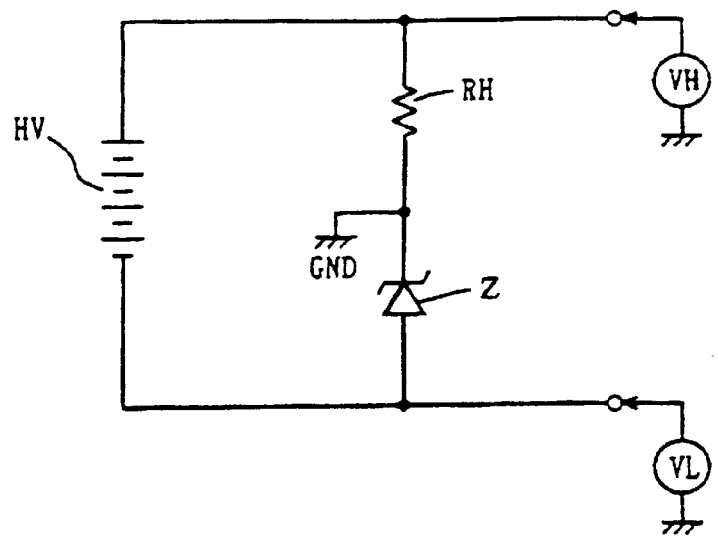
FIG. 3 is a circuit diagram showing a part of the configuration of an electric potential sensor according to a second embodiment of the present invention.
Figure 4:
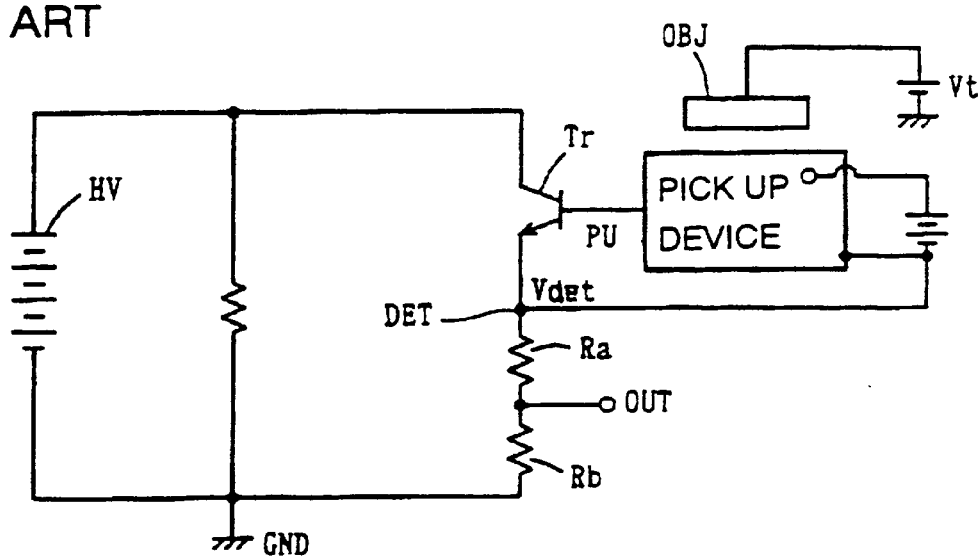
FIG. 4 is a diagram showing one example of a configuration of a prior art electric potential sensor.
Figure 5:
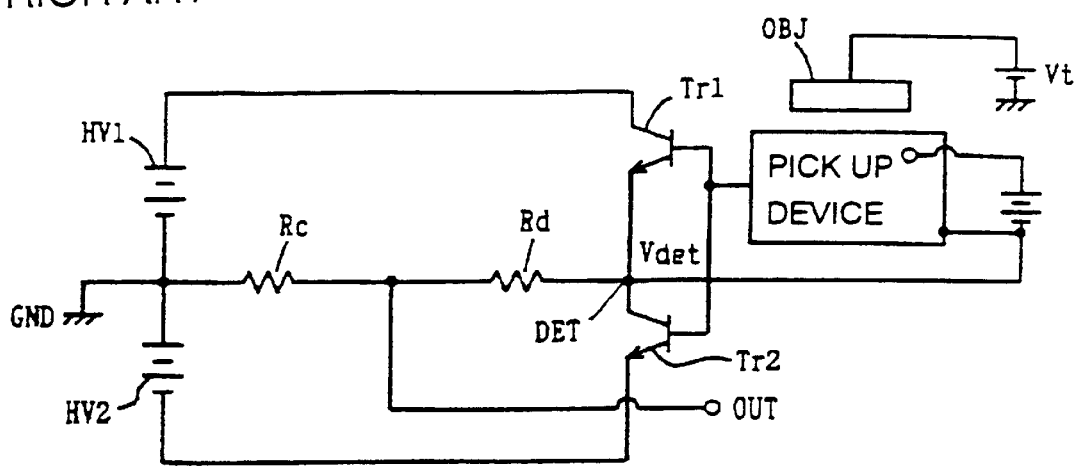
FIG. 5 is a diagram showing another example of the configuration of the prior art electric potential sensor.

FIG. 3 is a block diagram showing a portion of an electric potential sensor according to a second embodiment of the present invention. FIG. 3 only shows that portion of the electric potential sensor which is different than the first embodiment. This embodiment is identical to the first embodiment except that a Zener diode Z is substituted for the resistor RL. Since the Zener voltage VZ of the Zener diode Z is constant, it makes possible to use a wide range of power sources and still achieve the desired output range.

With the structure of the first embodiment which uses resistances RH, RL as the potential dividing means, there is the possibility that the potential dividing ratio RH:RL= VH:VL (VH: a voltage of the first potential dividing means, VL: a voltage of the second potential dividing means) cannot be maintained, depending on an operational state of the transistor Tr.

Further, to reduce the affect of the operational state of the transistor Tr, it is necessary to increase the current flowing through the two resistance RH, RL which degrades the efficiency of the system as a whole. By using a Zener diode as one of the two potential dividing means (in the illustrated embodiment the second potential dividing means) it is possible to keep the voltage VL of the second potential dividing means constant even when the power source HV is changed.

In the embodiment disclosed, a Zener diode is used for the second potential dividing means. Alternatively, a Zener diode may be used as the first potential dividing means.

Although the disclosed embodiment, a bipolar transistor is employed in the electric potential sensor according to the preferred embodiment of the present invention, a field effect transistor may also be used. In that case, the pickup device controls a gate voltage of the field effect transistor.

In the disclosed embodiments, the first and second potential dividing means are resistors or Zener diodes. However, any other suitable potential dividing circuitry can be used, for example, a plurality of diodes or a battery in addition to resistors and Zener diodes may be used.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An electric potential sensor, comprising:

a power source including a first output terminal having a first electric potential, a second output terminal having a second electric potential;

a first and a second potential dividing means connected in series between said first output terminal and said second output terminal;

a ground node connected to a mutual connection node of said first potential dividing means and said second potential dividing means;

a first resistance element connected between said ground node and an output node;

a second resistance element connected between said output node and a detection node;

a transistor connected between said first output terminal and said detection node;

a pickup device for controlling a base current or a gate voltage of said transistor such that an electric potential of said detection node is equal to an electric potential of an object to be measured; and a third resistance element connected between said detection node and said second output terminal.

2. An electric potential sensor according to claim 1, wherein said first and second potential dividing means are resistors.

3. An electric potential sensor according to claim 1, wherein either one of said first potential dividing means or said second potential dividing means is a Zener diode.

* * * * *